US007143487B2

(12) United States Patent
Kikuchi et al.

(10) Patent No.: US 7,143,487 B2
(45) Date of Patent: Dec. 5, 2006

(54) METHOD OF MANUFACTURING THE MATRIX TYPE ULTRASONIC PROBE

(75) Inventors: Manabu Kikuchi, Saitama (JP); Yoshihiro Tahara, Saitama (JP)

(73) Assignee: Nihon Denpa Kogyo Co., Ltd., Tokyo (JP)

( * ) Notice: Subject to any disclaimer, the term of this patent is extended or adjusted under 35 U.S.C. 154(b) by 164 days.

(21) Appl. No.: 10/866,339

(22) Filed: Jun. 10, 2004

(65) Prior Publication Data

US 2004/0239212 A1 Dec. 2, 2004

Related U.S. Application Data

(62) Division of application No. 10/173,325, filed on Jun. 17, 2002, now Pat. No. 6,803,701.

(30) Foreign Application Priority Data

Jun. 19, 2001 (JP) ............................ 2001-185357

(51) Int. Cl.
*H04R 17/00* (2006.01)
*H01L 41/04* (2006.01)

(52) U.S. Cl. ......................... 29/25.35; 29/835; 29/840; 29/843; 29/846; 29/850; 310/334

(58) Field of Classification Search ............... 29/25.35, 29/840, 843, 846, 835, 854; 310/334, 326, 310/336, 348; 367/155; 600/462
See application file for complete search history.

(56) References Cited

U.S. PATENT DOCUMENTS

| | | | |
|---|---|---|---|
| 4,371,805 A | 2/1983 | Diepers et al. | |
| 4,467,237 A | 8/1984 | Piaget et al. | |
| 4,747,192 A * | 5/1988 | Rokurota | 29/25.35 |
| 5,045,746 A | 9/1991 | Wersing et al. | |
| 5,764,596 A * | 6/1998 | Hanafy et al. | 367/153 |
| 6,308,389 B1 * | 10/2001 | Tezuka | 29/25.35 |
| 6,341,408 B1 | 1/2002 | Bureau et al. | |
| 6,566,265 B1 | 5/2003 | Esashi et al. | |

FOREIGN PATENT DOCUMENTS

| | | |
|---|---|---|
| JP | 62-034500 | 2/1987 |
| JP | 08-289398 | 11/1996 |
| JP | 10-282074 | 10/1998 |
| JP | 2000-041299 | 2/2000 |

* cited by examiner

*Primary Examiner*—A. Dexter Tugbang
*Assistant Examiner*—Tai Van Nguyen
(74) *Attorney, Agent, or Firm*—Katten Muchin Rosenman LLP

(57) ABSTRACT

A matrix type ultrasonic probe is disclosed, which has a backing material, and a plurality of piezoelectric elements having upper and lower face electrodes, respectively, and arrayed in two-dimensional directions on the backing material. The ultrasonic probe further has first mounts provided for every piezoelectric element and fixedly secured to the backing material, signal lines provided for every piezoelectric element and embedded in the backing material to be exposed on the surface of the respective first mounts, and second mounts provided for every piezoelectric element to be fixedly secured to the lower face of the piezoelectric element and formed therein with through-holes. The first and second mounts are fixedly secured to one another by means of conductive adhesive, and the signal lines and the lower face electrodes are electrically connected to one another by means of the conductive adhesive.

4 Claims, 6 Drawing Sheets

METHOD OF MANUFACTURING THE MATRIX TYPE ULTRASONIC PROBE

This is a division of application Ser. No. 10/173,325 filed Jun. 17, 2002 now U.S. Pat. No. 6,803,701.

BACKGROUND OF THE INVENTION

1. Field of the Invention

The present invention relates to a matrix type ultrasonic probe constructed by arranging a plurality of piezoelectric elements in two-dimensional directions and a method of manufacturing the same. More particularly, it relates to a matrix type ultrasonic probe provided with a plurality of minute piezoelectric elements and a method of manufacturing the same.

2. Description of the Related Art

The ultrasonic probe is used as a unit for transmitting and receiving an ultrasonic wave in ultrasonic diagnostic equipment for a medical purpose and so on. In recent years, for example, as Japanese Laid-open Patent Application No. 2000-41299 (JP, P2000-41299 A) discloses, a matrix type ultrasonic probe in which a plurality of piezoelectric element are arranged in two-dimensional directions has come into notice. When the matrix type ultrasonic probe is applied to an examinee, i.e., a living organism, a stereoscopic picture can be obtained in real time as in vivo information.

As shown in FIG. 1, the matrix type ultrasonic probe according to the background art mostly has been provided with such a construction that a plurality of piezoelectric elements 2 are disposed in two-dimensional directions on backing material 1. Backing material 1 has a surface thereof onto which mounts or pedestals 3 made of, for example, resin are secured. Mount 3 is provided for every piezoelectric element 2, and is interposed between piezoelectric element 2 and backing material 1. In backing material 1, a plurality of strip-shape signal lines 4 is embedded. One end of signal line 4 is exposed on the surface of mount 3, and the other end of each signal line 4 is led out of the back of backing material 1. Each piezoelectric element 2 has, on upper and lower faces thereof, electrodes 5*a* and 5*b*, respectively. Each piezoelectric element 2 is fixedly secured to the surface of mount 3 by conductive adhesive (not shown), whereby signal line 4 exposed on the surface of mount 3 is electrically connected to lower electrode 5*b* of piezoelectric element 2.

Next, a description of the manufacturing method of such matrix type ultrasonic probe according to the background art will be provided with reference to FIG. 2. To begin with, a plurality of pectinate metallic thin plates 7, each being formed in a comb by combining ends of strip-shape signal lines 4 with connecting member 6 are prepared, and these metallic thin plates are embedded in backing material 1 in a parallel state. Onto the surface of backing material 1, a resin plate 3A to be formed in mounts 3 is fixedly secured beforehand by adhesive. At this time, connecting members 6 of metallic thin plates 7 are arranged so as to be exposed on the surface of resin plate 3A. Then, on the surface of resin plate 3A, piezoelectric plate 2A preliminarily provided, on opposite faces thereof, with electrodes 5A and 5B, respectively, is fixedly secured by conductive adhesive. Resin plate 3A and piezoelectric plate 2A are respectively shaped to have an extent substantially corresponding to the two-dimensional matrix of a plurality of piezoelectric elements 6.

Thereafter, slits 8 (refer to FIG. 1) reaching backing material 1 from the upper surface of piezoelectric plate 2A is provided for cutting piezoelectric plate 2A, resin plate 3A and connecting member 6 so as to form a plurality of piezoelectric elements 2, and mounts 3A and signal lines 4 for every piezoelectric plate 2. As a result, plural piezoelectric elements 2 arrayed in two-dimensional directions and having signal lines 4 led out of lower face electrodes 5*b* are acquired. In each slit 8, non-illustrated filler is applied. Upper face electrodes 5*a* of respective piezoelectric elements 2 are commonly connected to one another by metallic film formed by the method of deposition or the like, and are grounded to the earthing potential. Thus, the matrix type ultrasonic probe as shown in FIG. 1 is completely manufactured.

By the way, in order to increase the resolution of such matrix type ultrasonic probe, reduction in the size of piezoelectric element 2 has been brought into practice. For example, reduction in the planar size of each piezoelectric element 2 to approximately 0.2 mm×0.2 mm has been tried. When it is assume that the oscillating frequency of such piezoelectric element 2 is, for example, approximately 2.5 MHz, the corresponding thickness (height) of piezoelectric element 2 would reach 0.6 mm, and accordingly, the height of piezoelectric element 2 must be appreciably large in comparison with the width thereof. Therefore, during the manufacturing process, when piezoelectric plate 2A is severed or divided by cutting into piezoelectric elements 2, securing strength by the conductive adhesive is rather small, so that piezoelectric elements 2 are apt to be fallen. Thus, a problem occurs such that piezoelectric elements 2 fail to be arranged in position on backing material 1.

SUMMARY OF THE INVENTION

An object of the present invention is to provide a matrix type ultrasonic probe, which enables it to prevent falling of piezoelectric elements at the stage of diving a piezoelectric plate into a plurality of piezoelectric elements after the piezoelectric plate is secured to a backing material.

Another object of the present invention is to provide a method of manufacturing a matrix type probe, which enables it to prevent falling of piezoelectric elements at the stage of diving a piezoelectric plate into a plurality of piezoelectric elements after the piezoelectric plate is secured to a backing material.

The object of the present invention can be achieved by a matrix type ultrasonic probe including a backing material, a plurality of piezoelectric elements having upper and lower face electrodes, respectively, and arrayed in two-dimensional directions on the backing material, first mounts provided for every piezoelectric element and fixedly secured to the backing material, and signal lines provided for every piezoelectric element and embedded in the backing material while being exposed on surfaces of the first mounts, wherein the matrix type ultrasonic probe comprises second mounts provided for every piezoelectric element to be fixedly secured to a lower face of the piezoelectric element, and formed therein with through-holes, the first and second mounts are fixedly secured to one another by means of conductive adhesive, and the signal lines and the lower face electrodes are electrically connected to one another by means of the conductive adhesive.

Another object of the present invention is achieved by a manufacturing method of a matrix type ultrasonic probe having a backing material, and a plurality of piezoelectric elements having upper and lower face electrodes, respectively, and arrayed in two-dimensional directions on the backing material, wherein the method comprises the steps of: providing the backing material having a surface provided thereon with a first plate member, which has a surface to which one ends of signal lines corresponding to every piezoelectric elements are exposed; fixedly securing, by conductive adhesive, a piezoelectric plate, which has a lower face provided thereon with a second plate member formed therein with through-holes corresponding to each of the piezoelectric elements, to the backing material provided with the first plate member; and dividing the piezoelectric plate into individual piezoelectric elements by forming slits extending from an upper face of the piezoelectric plate and reaching the backing material.

In the present invention, since either the second mount or the second plate member is improved in its adaptability to the conductive adhesive, the strength of adhesion of the conductive adhesive is appreciably increased. As a result, falling down of the piezoelectric elements during the manufacturing process can be well prevented.

DETAILED DESCRIPTION OF THE INVENTION

Figure 1:
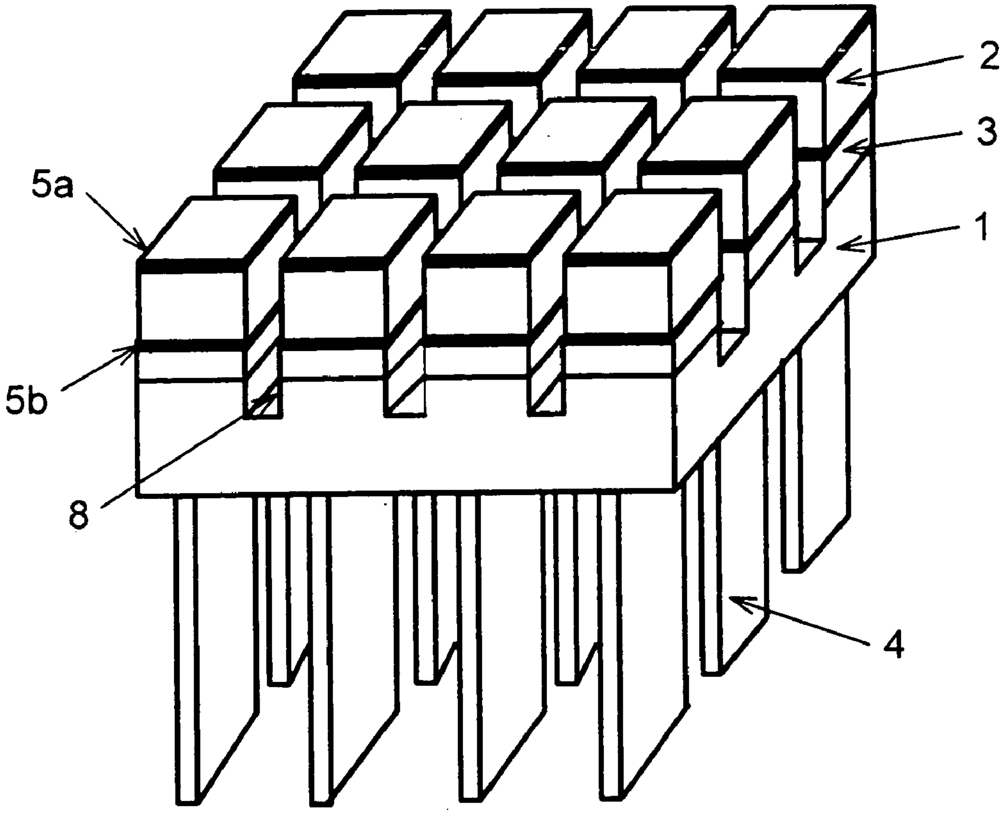
FIG. 1 (BACKGROUND ART)
FIG. 1 is a perspective view illustrating a matrix type ultrasonic probe according to the background art.
Figure 2:
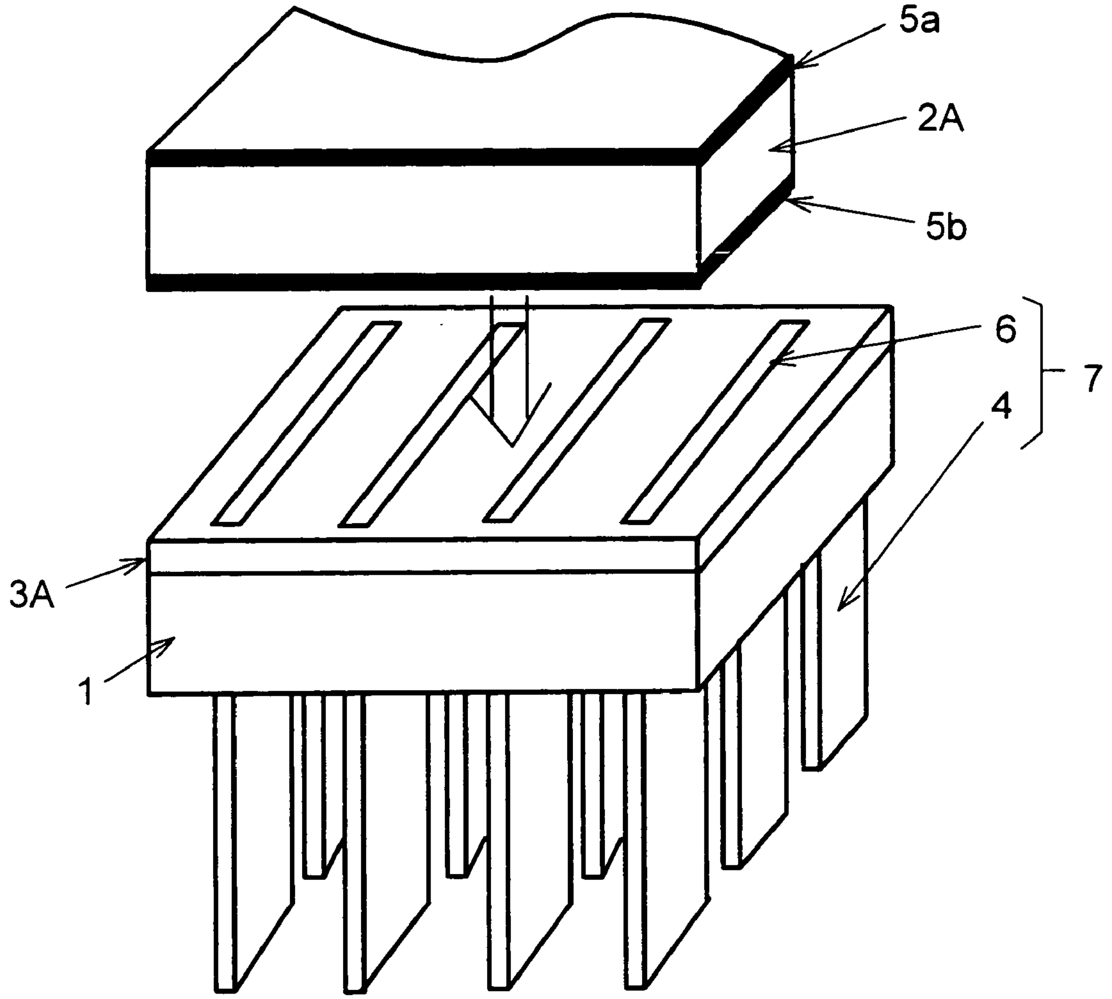
FIG. 2 (BACKGROUND ART)
FIG. 2 is a perspective view illustrating the manufacturing process of the matrix type ultrasonic probe according to the background art.
Figure 3:
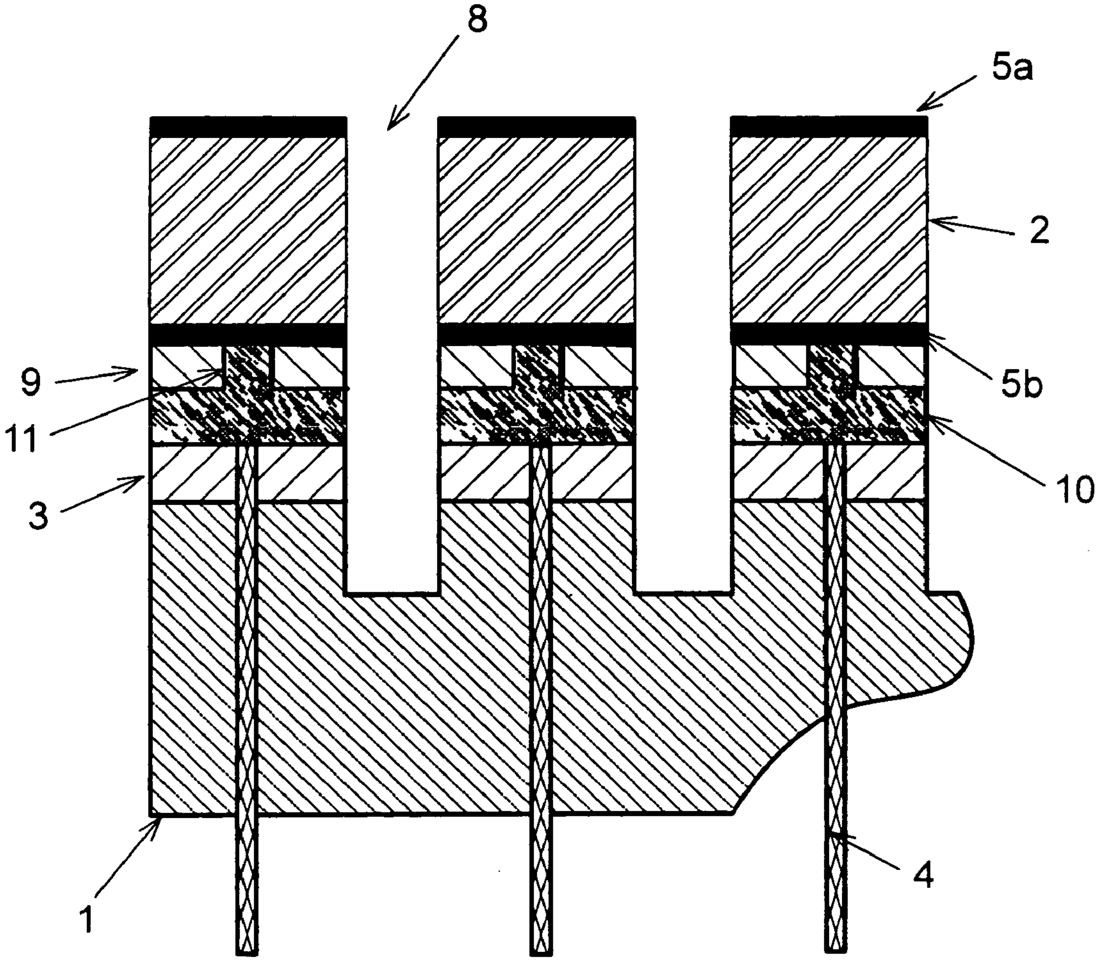
FIG. 3 is a partial cross-sectional view illustrating a matrix type ultrasonic probe according to an embodiment of the present invention.
Figure 4:
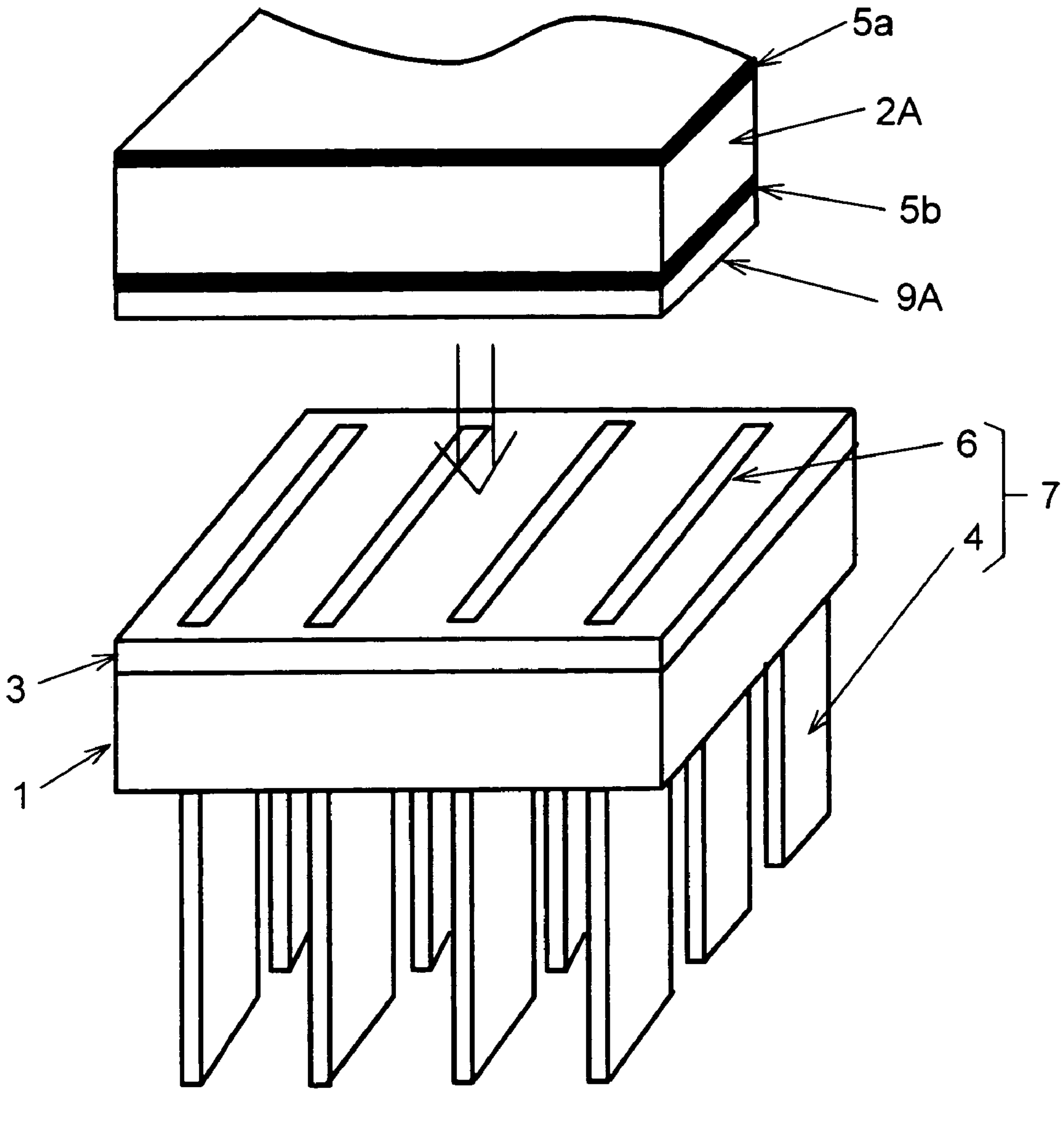
FIG. 4 is a perspective view illustrating the manufacturing process of the matrix type ultrasonic probe as shown in FIG. 3.
Figure 5:
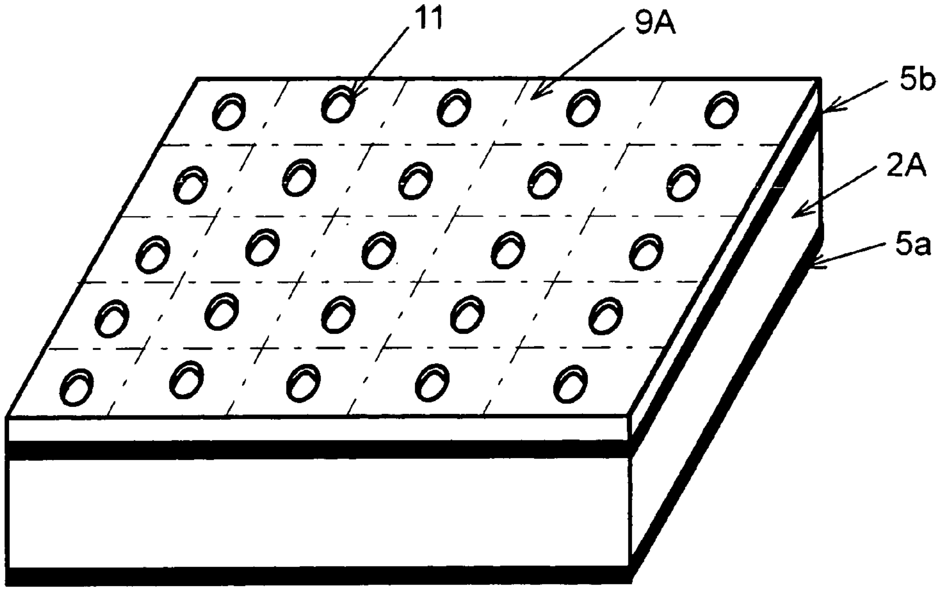
FIG. 5 is a perspective view illustrating a second resin plate fixedly secured to a piezoelectric plate.

In FIGS. 3 to 5, which illustrate a matrix type ultrasonic probe according to a preferred embodiment of the present invention, constituting portions designated by the same reference numerals as those in FIGS. 1 and 2 are identical with those in FIGS. 1 and 2, and accordingly, any detailed description thereof will not be repeated hereinbelow.

In comparison with the matrix type ultrasonic probe as shown in FIG. 1, the matrix type ultrasonic probe as illustrated in FIG. 3 is different in that other than first mounts 3 fixedly secured to the surface of backing material 1, a second mount 9 or second pedestal formed therein with a through-hole 11 is provided for every piezoelectric element 2. Second mounts 9 are fixedly secured to the lower faces of respective piezoelectric elements 2 and are further fixedly secured to first mounts 3 by means of conductive adhesive 10. Conductive adhesive 10 is poured into and fills through-holes 11 of second mounts 9. Since one ends of signal lines 4 are exposed on the surface of first mounts 3, lower face electrodes 5*b* of piezoelectric elements 2 are eventually electrically connected to signal lines 4 via conductive adhesive 10.

Now, a description of the manufacturing method of this matrix type ultrasonic probe will be provided below.

As illustrated in FIG. 4, onto the surface of backing material 1, resin plate 3A to be formed in first mounts 3 is beforehand fixedly secured by adhesive or the like. The adhesive to be used for fixedly securing resin plate 3A to backing material 1 should preferably be insulating adhesive having adhesion or connecting strength generally larger than that exhibited by the conductive adhesive. Pectinate metallic thin plates 7, each having such a form that one ends of oblong-shape or strip-shape signal lines 4 are all connected to connecting portion 6 are embedded in parallel in backing material 1. At this stage, connecting portions 6 of metallic thin plates 7 are arranged to be exposed on the surface of resin plate 3A.

On the other hand, second resin plate 9A to be formed in second mounts 9 is fixedly secured by an adhesive to the lower face of piezoelectric plate 2A having opposite primary faces on which electrodes 5*a* and 5*b* are beforehand provided. The adhesive used for securing second resin plate 9A to piezoelectric plate 2A should preferably be insulating adhesive having adhesion generally larger than that of the conductive adhesive. Second resin plate 9A is provided with through-holes 11, which are arranged in two-dimensional directions so as to be in registration with the center of lower face electrode 5*b* of each piezoelectric element 2, as illustrated in FIG. 5. At the bottom of each through-hole 11, lower face electrode 5*b* is exposed. Through-holes 11 are formed by cutting or the like after second resin plate 9A is fixedly secured to piezoelectric plate 2A. Each of resin plates 3A and 9A and piezoelectric plate 2A has an extent corresponding to a plurality of piezoelectric elements 2.

Then, by means of conductive adhesive 10, piezoelectric plate 2A is fixedly secured to first resin plate 3A in such a manner that second resin plate 9A confronts first resin plate 3A. At this time, amount of application of conductive adhesive 10 is controlled so that conductive adhesive 10 comes into through-holes 11 of second resin plate 9A until it is electrically connected to lower face electrode 5*b*.

Subsequently, slits 8 extending from the uppermost of piezoelectric plate 2A and reaching backing material 1 are provided for cutting piezoelectric plate 2A, first and second resin plates 3A and 9A, and connecting portion 6, thereby dividing piezoelectric plate 2A into individual piezoelectric elements 2 while forming first and second mounts 3 and 9 for every piezoelectric element 2. As a result, the plurality of piezoelectric elements 2 arranged in two-dimensional directions and having respective signal lines 4 led out of respective lower face electrodes 5*b* are acquired. At this stage, the size of each piezoelectric element 2 is set to be, for example, approximately 0.2 mm×0.2 mm, and 0.6 mm thick (height), as described before.

According to the above-described constitution, second resin plate 9A provided on lower face electrode 5*b* of piezoelectric plate 2A is able to exhibit good adaptability with conductive adhesive 10, and therefore the adhesion strength between them can be increased. Further, provision of through-holes 11 permits not only conductive adhesive 10 to be surely electrically connected to lower face electrode 5*b* but also second resin plate 9A to increase its connecting area with conductive adhesive 10 thereby further increasing the adhesion strength exhibited by conductive adhesive 10. Thus, even if the height of respective piezoelectric elements 2 becomes high relative to the width thereof, falling of piezoelectric elements 2 can be prevented during the cutting process for dividing piezoelectric plate 2A into individual piezoelectric elements arranged on backing material 1.

Figure 6:
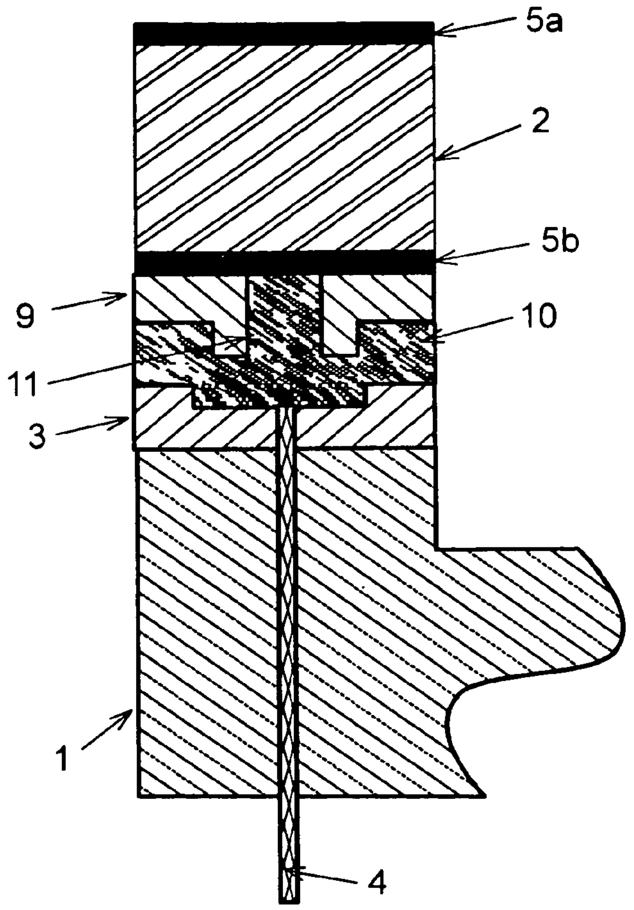
FIG. 6 is a partial cross-sectional view illustrating a matrix type ultrasonic probe according to another embodiment of the present invention.

In the foregoing description, although second resin plate 9A is provided with through-holes 11 intended merely for the electric conduction, when the shape of circumference of these through-holes 11 is modified, the securing strength exhibited by conductive adhesive can be further increased. For example, in the example shown in FIG. 6, a recess is provided in a region corresponding to a central portion of first mount 3 or pedestal, and the surrounding of through-hole 11 of second mount 9 or pedestal is formed in a projection, so that the recess and projection may be fitted with one another. According to this construction, connecting area due to conductive adhesive 10 may be increased to result in further strengthening the securing strength. Of course, the shape of the recess and projection may be arbitrarily set.

Figure 7:
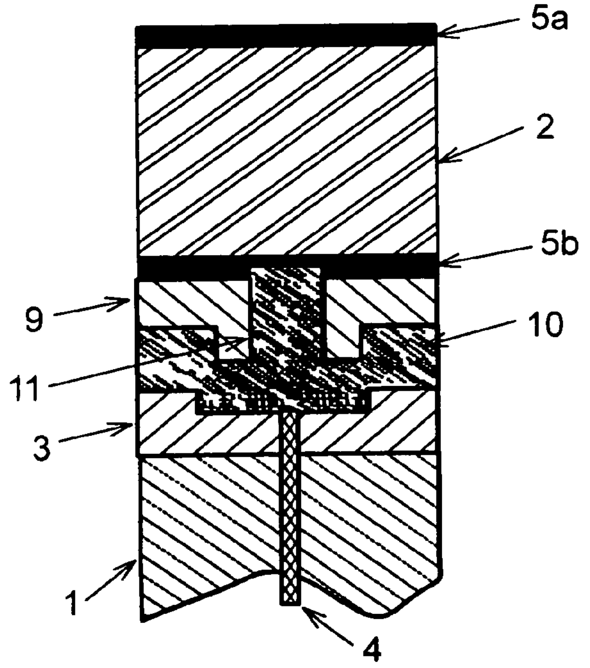
FIG. 7 is a partial cross-sectional view illustrating a matrix type ultrasonic probe according to a further embodiment of the present invention.

Further, as illustrated in FIG. 7, when through-holes 11 are provided for a resin plate constituting second mount 9, slits reaching lower face electrodes 5*b* may be provided for extending the connecting area with conductive adhesive 10 to thereby increase connecting strength. In this case, the thickness of respective lower face electrodes 5*b* may be preliminarily increased.

Although second resin plate 9A is formed with respective independent through-holes 11 corresponding to respective piezoelectric elements 2, grooves extending in the same direction as connecting portions 6 of metallic thin plates 7, which are exposed on the surface of first resin plate 3A may alternatively be provided.

Furthermore, although one ends of signal lines 4, i.e., connecting portions 6 are exposed on the surface of first resin plate 3A, connecting portions 6 may be projected from the surface of resin plate 3A for the purpose of ensuring their electric connection with conductive adhesive 10. Although first and second mounts 3 and 9 are made of a resin plate, the material for both mounts 3 and 9 is not limited to the described resin plate, and various insulating plate or conductive plate may be used. Namely, it is important that the plate constituting mounts 3 and 9 should have good adaptability with conductive adhesive 10.

While preferred embodiments of the present invention have been described using specific terms, such description is for illustrative purpose only, and it is to be understood that changes and variations may occur to a person skilled in the art without departing from the spirit or scope of the following claims.

What is claimed is:

1. A manufacturing method of a matrix type ultrasonic probe having a backing material, and a plurality of piezoelectric elements having upper and lower face electrodes, respectively, and arrayed in two-dimensional directions on said backing material, said method comprising the steps of:

providing the backing material having a surface provided thereon with a first plate member, which has a surface to which one ends of signal lines corresponding to every piezoelectric elements are exposed;

fixedly securing, by conductive adhesive, a piezoelectric plate, which has a lower face provided thereon with a second plate member formed therein with through-holes corresponding to each of the piezoelectric elements, to the backing material provided with said first plate member; and dividing said piezoelectric plate into individual piezoelectric elements by forming slits extending from an upper face of said piezoelectric plate and reaching said backing material, wherein said first and second plate members are made of a resin plate, respectively.

2. The manufacturing method according to claim 1, further comprising the steps of:

fixedly securing said second plate member to a lower face of said piezoelectric plate; and forming through-holes in the second plate member in a manner such that said lower face electrodes are exposed, after said fixedly securing step.

3. The manufacturing meted according to claim 2, wherein said second plate member is fixedly secured to said piezoelectric plate by means of adhesive.

4. The manufacturing meted according to claim 1, wherein said signal lines have a connecting portion corresponding to the plurality of piezoelectric elements, said connecting portion being exposed on a surface of said first plate member and divided for each of said piezoelectric elements during said dividing step.

* * * * *